United States Patent
Lu et al.

(10) Patent No.: US 10,522,382 B2
(45) Date of Patent: Dec. 31, 2019

(54) METHOD OF MANUFACTURING A SEMICONDUCTOR DEVICE

(71) Applicant: Taiwan Semiconductor Manufacturing Company, Ltd., Hsinchu (TW)

(72) Inventors: Yung-Jean Lu, Taipei (TW); Ming-Fa Chen, Taichung (TW); Chen-Shien Chen, Zhubei (TW); Jao Sheng Huang, Jiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 23 days.

(21) Appl. No.: 15/715,839

(22) Filed: Sep. 26, 2017

(65) Prior Publication Data

US 2018/0019149 A1    Jan. 18, 2018

Related U.S. Application Data

(62) Division of application No. 14/513,104, filed on Oct. 13, 2014, now Pat. No. 9,786,540, which is a division of application No. 12/840,903, filed on Jul. 21, 2010, now Pat. No. 8,859,424.

(60) Provisional application No. 61/233,922, filed on Aug. 14, 2009.

(51) Int. Cl.
    *H05K 3/00*    (2006.01)
    *H01L 21/683*    (2006.01)

(52) U.S. Cl.
    CPC ..... *H01L 21/6833* (2013.01); *Y10T 29/49124* (2015.01)

(58) Field of Classification Search
    CPC .... H01L 21/6831; H01L 24/11; Y10T 279/23; Y10T 29/49126; Y10T 29/49124; Y10T 156/10
    USPC .................................. 29/829, 825, 846, 852
    See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,312,621 B1 * | 11/2001 | Pedigo ..................... | H01B 1/22 174/256 |
| 6,322,903 B1 | 11/2001 | Siniaguine et al. | |
| 6,448,168 B1 | 9/2002 | Rao et al. | |
| 6,452,775 B1 | 9/2002 | Nakajima | |
| 6,465,892 B1 | 10/2002 | Suga | |
| 6,472,293 B1 | 10/2002 | Suga | |

(Continued)

FOREIGN PATENT DOCUMENTS

| TW | 200701428 A | 1/2007 |
|---|---|---|
| TW | 200828553 A | 7/2008 |

*Primary Examiner* — Thiem D Phan
(74) *Attorney, Agent, or Firm* — Slater Matsil, LLP

(57) ABSTRACT

A system and method for a semiconductor wafer carrier is disclosed. An embodiment comprises a semiconductor wafer carrier wherein conductive dopants are implanted into the carrier in order to amplify the coulombic forces between an electrostatic chuck and the carrier to compensate for reduced forces that result from thinner semiconductor wafers. Another embodiment forms conductive layers and vias within the carrier instead of implanting conductive dopants.

20 Claims, 3 Drawing Sheets

(56) References Cited

U.S. PATENT DOCUMENTS

| | | |
|---|---|---|
| 6,538,333 B2 | 3/2003 | Kong |
| 6,599,778 B2 | 7/2003 | Pogge et al. |
| 6,611,417 B2 | 8/2003 | Chen |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,731,496 B2 | 5/2004 | Hiramatsu et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,928,726 B2 * | 8/2005 | Zollo ............... H05K 1/185 174/260 |
| 6,962,867 B2 | 11/2005 | Jackson et al. |
| 6,962,872 B2 | 11/2005 | Chudzik et al. |
| 7,004,180 B2 | 2/2006 | Akiba |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,619,870 B2 | 11/2009 | Himori et al. |
| 7,651,889 B2 * | 1/2010 | Tang ............... H01L 21/561 257/620 |
| 2001/0050836 A1 | 12/2001 | Tomaru et al. |
| 2005/0042881 A1 | 2/2005 | Nishimoto et al. |
| 2005/0194038 A1 | 9/2005 | Brabec et al. |
| 2006/0073337 A1 | 4/2006 | Nauka et al. |
| 2007/0004172 A1 | 1/2007 | Yang |
| 2008/0145970 A1 | 6/2008 | Terazaki et al. |
| 2009/0243083 A1 | 10/2009 | Han et al. |
| 2010/0330798 A1 | 12/2010 | Huang et al. |
| 2011/0035937 A1 | 2/2011 | Lu et al. |
| 2015/0040387 A1 | 2/2015 | Lu et al. |

* cited by examiner

METHOD OF MANUFACTURING A SEMICONDUCTOR DEVICE

CROSS-REFERENCE TO RELATED APPLICATIONS

This application is a divisional of U.S. patent application Ser. No. 14/513,104, filed Oct. 13, 2014, which is a divisional of U.S. patent application Ser. No. 12/840,903, filed Jul. 21, 2010, and entitled "Semiconductor Wafer Carrier and Method of Manufacturing," which claims the benefit of U.S. Provisional Patent Application Ser. No. 61/233,922, filed on Aug. 14, 2009, and entitled "Semiconductor Wafer Carrier and Method of Manufacturing," which applications are incorporated herein by reference.

TECHNICAL FIELD

The disclosure relates generally to a system and method for manufacturing semiconductor devices and, more particularly, to a system and method for transporting and holding semiconductor wafers during processing.

BACKGROUND

Generally, electrostatic chucks may be used during the processing of semiconductor wafers in order to hold and transport semiconductor wafers and their carriers. Electrostatic chucks, as opposed to mechanical chucks that hold wafers by simply acting as a physical clamp, hold a wafer and carrier by applying a charge to a plate and generating an electrostatic force to hold the semiconductor wafer. Such an arrangement allows the electrostatic chuck to avoid contact with the side of the wafer to be processed (a contact which is unavoidable with typical clamping mechanical chucks), thereby preventing damage from occurring on that side of the wafer.

However, as the thickness of semiconductor wafers has been reduced in recent years, especially with the advent of through-substrate vias and the need for thinner semiconductor wafers, electrostatic chucks have run into a problem. Namely, the thinner wafers usually utilize an isolative carrier (e.g., glass) in order to help support the thinner semiconductor wafer structure. However, with the isolative carrier providing little coulombic forces itself and the thinner semiconductor wafers providing less coloumbic forces than the previous thicker wafers, these wafers and carriers require larger and larger bias voltages in order to provide enough of an attractive force between the electrostatic chuck and the wafer/carrier combination to actually hold the wafer/carrier combination to the chuck. However, such a large bias voltage not only increases the cost of production by requiring more energy, but may also damage the semiconductor wafer during processing.

SUMMARY

In accordance with an embodiment, a semiconductor device comprises a semiconductor wafer carrier. The semiconductor wafer carrier comprises a dielectric material. The semiconductor wafer also comprises a conductive dopant located within the dielectric material.

In accordance with another embodiment, a semiconductor device comprises a semiconductor wafer carrier for carrying semiconductor wafers. The semiconductor wafer carrier comprises a dielectric material. Conductive vias are located within the dielectric material.

In accordance with yet another embodiment, a method of manufacturing a semiconductor device comprises providing a semiconductor wafer carrier. Conductive materials are placed into the semiconductor wafer carrier.

BRIEF DESCRIPTION OF THE DRAWINGS

For a more complete understanding of the disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of embodiments are discussed in detail below. It should be appreciated, however, that the disclosure provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a semiconductor wafer carrier. Other embodiments may also be applied, however, to other carriers or supporting structures.

Figure 1:
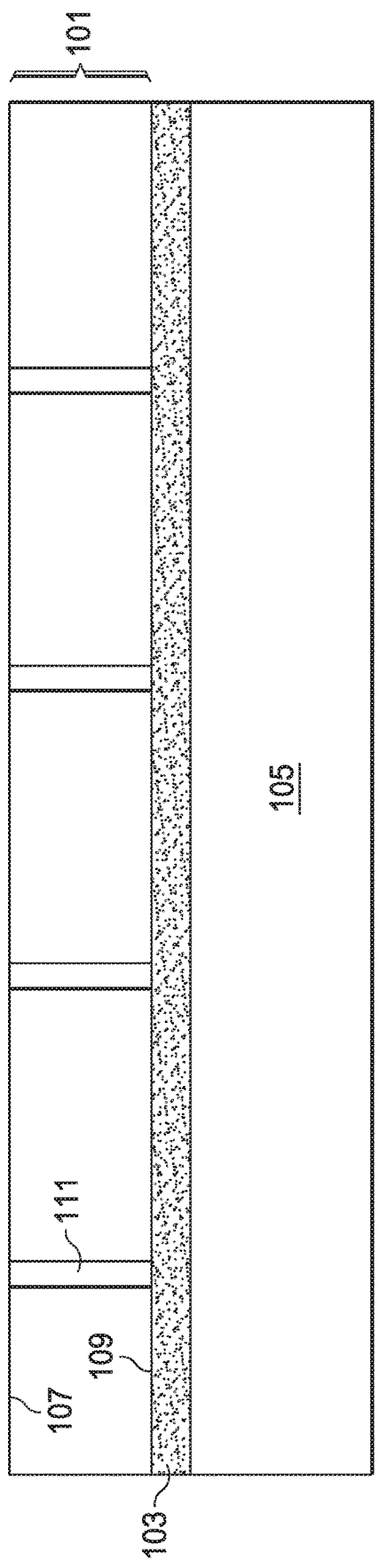
FIG. 1 illustrates a semiconductor wafer, an adhesive, and a carrier in accordance with an embodiment.

With reference now to FIG. 1, there is shown a semiconductor wafer 101, an adhesive 103, and a carrier 105. The semiconductor wafer 101 generally comprises a plurality of individual dies, wherein each die includes a substrate having electronic devices formed thereon as is known in the art. The substrate is typically covered with one or more dielectric layers and conductive layers. The conductive layers provide connectivity and routing for the underlying electronic devices.

The semiconductor wafer 101 may have a first side 107 upon which the electronic devices and dielectric and metal layers are located. The semiconductor wafer 101 may also have a second side 109 located opposite the first side 107.

One or more of the individual dies of the semiconductor wafer 101 may have one or more through-substrate vias (TSVs) 111 formed through the semiconductor wafer 101. The TSVs 111 are formed by initially forming conductive vias at least partially through the semiconductor wafer 101. The conductive vias are formed by applying and developing a suitable photoresist (not shown), and then etching the first side 107 of the semiconductor wafer 101 to form via openings. The via openings may be formed so as to extend into the semiconductor wafer 101 at least further than the electrical devices formed within and on the semiconductor wafer 101, and at least to a depth greater than the eventual desired height of the dies. Accordingly, while the depth of the via openings from the surface of the semiconductor wafer 101 is dependent upon the overall design of the dies, the depth may be between about 50 µm and about 190 µm, such as about 150 µm. Further, the via openings may have a diameter of between about 5 µm and about 70 µm, such as about 50 µm.

A barrier layer (not shown) may be formed along the sidewalls of the via openings. The barrier layer may comprise a conductive material such as titanium nitride, although other materials, such as tantalum nitride or titanium, may alternatively be utilized. The barrier layer may be formed using a CVD process, such as PECVD. However, other alternative processes, such as sputtering or metal organic chemical vapor deposition (MOCVD), may alternatively be used.

The via openings are then filled with a conductive material. The conductive material may be formed through an electrodeposition process and may comprise copper. However, other suitable methods, such as electroless deposition, plating, or CVD, and other suitable materials, such as tungsten, may alternatively be used to form the conductive material. In an embodiment, the conductive material completely fills and overfills the vias openings, and excess conductive material outside of the via openings may be removed through a process such as grinding or etching in order to form the conductive vias.

Once the conductive vias have been formed, the second side 109 of the semiconductor wafer 101 may be thinned so as to expose the conductive vias, thereby forming TSVs 111. The thinning of the semiconductor wafer 101 may be performed using a removal process such as chemical mechanical polishing (CMP), wherein a combination of etchant and abrasive are put into contact with the semiconductor wafer 101 and a grinding pad (not shown) is used to thin the semiconductor wafer 101. However, any suitable process for thinning the semiconductor wafer 101, such as etching, may alternatively be used.

However, as one of ordinary skill in the art will recognize, the above described process for forming the TSVs 111 are not the sole method by which the TSVs 111 may be formed. In another technique, the TSVs 111 may be formed by etching a via partially through the semiconductor wafer 101 and depositing a dielectric layer in the via. The second side 109 of the semiconductor wafer 101 may then be thinned to expose with the dielectric layer in the via. The dielectric remaining within the via is removed, and a conductive material, with or without a barrier layer, is re-deposited within the via. This method and other suitable methods are fully intended to be included within the scope of the current invention.

The adhesive 103 is placed over the second side 109 of the semiconductor wafer 101 in order to adjoin the thinned semiconductor wafer 101 to the carrier 105. The adhesive 103 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive may be placed onto the second side 109 of the semiconductor wafer 101 in a semi-liquid or gel form, which is readily deformable under pressure.

The carrier 105 is attached to the semiconductor wafer 101 by the adhesive 103 in order to provide structural support for the thinned semiconductor wafer 101 during further processing. The carrier 105 comprises, for example, silicon based materials, such as glass or silicon oxide, or other materials, such as aluminum oxide, combinations of any of these materials, or the like. The carrier 105 is planar in order to accommodate its attachment to the semiconductor wafer 101. The carrier 105 may have a thickness of between about 550 µm and about 750 µm, such as about 620 µm. Additionally, the carrier 105 may have a diameter that is greater than the semiconductor wafer 101. Accordingly, while the size of the carrier 105 will be in some ways dependent upon the size of the semiconductor wafer 101, the carrier 105 may have a diameter that is between about 1.5% and about 0.5% greater than the diameter of the semiconductor wafer 101. For example, if the semiconductor wafer 101 is about 300 mm in diameter, the carrier 105 would be about 303 mm in diameter.

The carrier 105 may also be doped with ionic dopants in order to provide a material within the carrier 105 that may be subject to the electrostatic forces generated by a electrostatic chuck (described further below with respect to FIG. 2). As such, the carrier 105 may be doped with one or more dopants such as sodium, potassium, combinations of these, or the like. The dopants may be introduced using a suitable implantation process such as an ion implantation or diffusion process and are implanted to at least a combined concentration of dopants (e.g., sodium and potassium) of $5 \times 10^{14}$ $cm^{-1}$. However, any suitable method may alternatively be utilized.

By incorporating these ionic dopants into the carrier 105, the coloumbic forces between the carrier 105 and the electrostatic chuck 201 (described below with respect to FIG. 2) may be increased. Such an increase helps to insure that there are adequate forces to hold and control the carrier 105 and the semiconductor wafer 101 when they are attached to the electrostatic chuck 201.

In addition to the ionic dopants as described above, secondary dopants may also be implanted along with the ionic dopants in order to enhance the conductivity of the ionic dopants. In an embodiment, the secondary dopants may comprise such dopants as aluminum, boron, phosphorous, combinations of these, or the like, may be implanted through a suitable implantation process such as ion implantation or diffusion process. These dopants are implanted to have a concentration of less than about $5 \times 10^{22}$ $cm^{-1}$, such as about $1 \times 10^{12}$ $cm^{-1}$.

Figure 2:
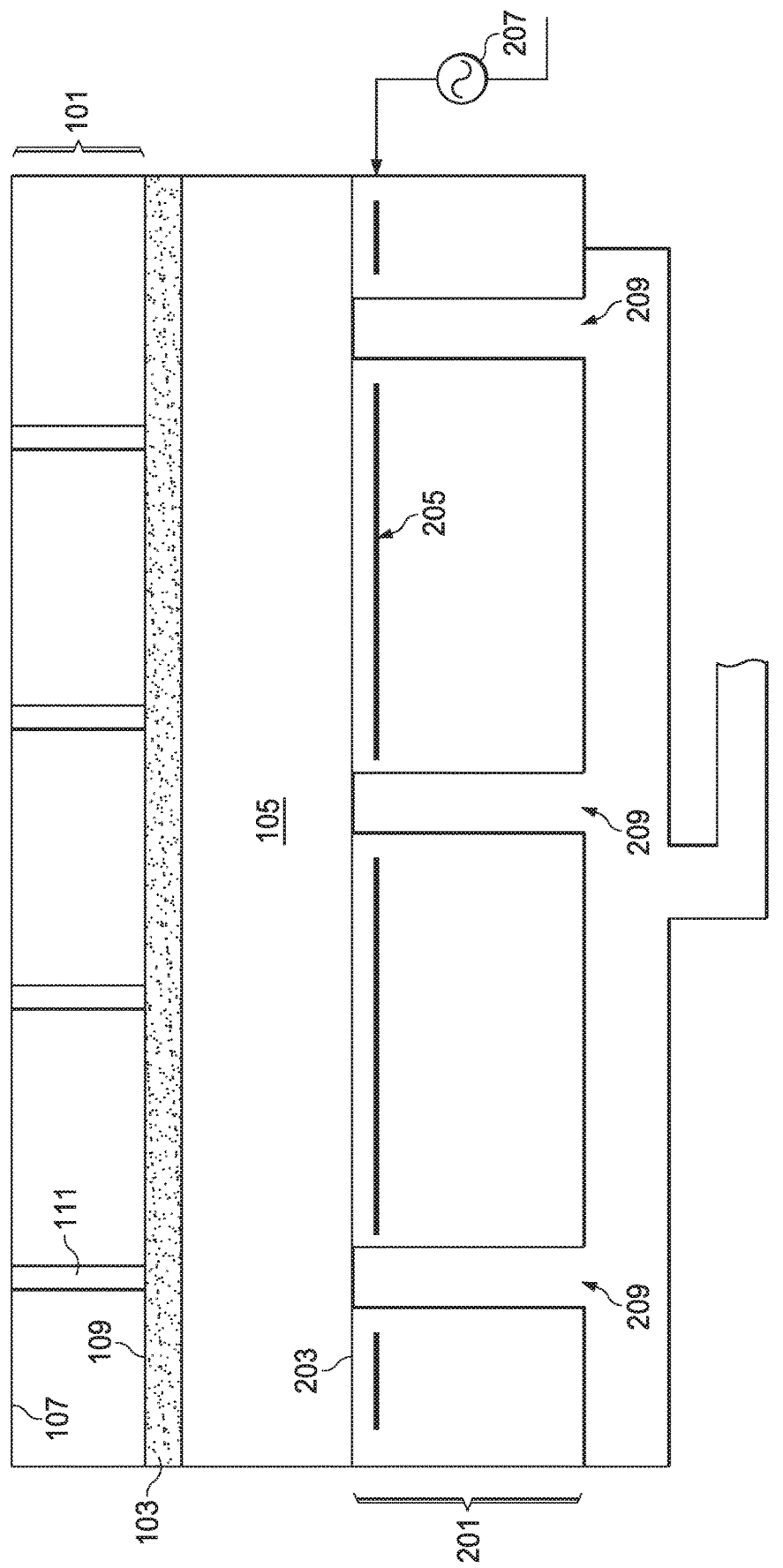
FIG. 2 illustrates the placement of the semiconductor wafer and the carrier described in FIG. 1 onto an electrostatic chuck in accordance with an embodiment.

FIG. 2 illustrates the placement of the semiconductor wafer 101 and the carrier 105 onto an electrostatic chuck 201. In an embodiment the carrier 105 is placed in contact with a top surface 203 of the electrostatic chuck 201 such that the first side 107 of the semiconductor wafer 101 remains exposed for further processing such as etching or deposition processes in a plasma processing chamber. As such, the electrostatic chuck 201 may be used to move and bias the semiconductor wafer 101 without having to cover any portion of the first side 107 of the semiconductor wafer 101.

In an embodiment the electrostatic chuck 201 is a monopolar type of electrostatic chuck 201. In a monopolar type of electrostatic chuck 201 an electrode 205 is embedded near the top surface 203 of the electrostatic chuck 201. The electrode 205 is covered by a dielectric material such as an oxide or a ceramic so as to separate the electrode 205 from the carrier 105. In an embodiment, the electrode 205 is embedded below the top surface 203 of the electrostatic chuck 201 a distance of between about 1.5 mm and about 0.1 mm, such as about 0.3 mm.

In an embodiment, a positive charge may applied to the electrode 205 by a power source 207 in a range of between about 4,000 W and about 1,000 W, such as about 2,500 W, when Na+ and K+ are over $5 \times 10^{14}$ $cm^{-1}$ is used as the dopant. The charge on the electrode 205 causes coulombic forces to act upon the semiconductor wafer 101 along with the doped carrier 105 such that the carrier 105 and the semiconductor wafer 101 are adhered to the electrostatic chuck 201. Further, when the electrostatic chuck 201 is used in conjunction with a plasma processing apparatus (not shown), the electrode 205 may be used along with another electrode (not shown) to generate a plasma in the chamber to assist in etching, film formation, or diffusion processes.

However, as one of ordinary skill in the art will recognize, the recited applied charges are meant to be illustrative, and are not meant to be limiting. Other charges may alternatively be applied to the electrode 205 and may vary depending upon the precise process conditions desired and dopants chosen. These alternative charges are fully intended to be included within the scope of the present invention as long as the alternative charges work with the doped carrier 105 to increase the columbic attraction between the doped carrier 105 and the electrostatic chuck 201.

Additionally, the structure of the electrostatic chuck 201 may comprise one or more openings 209 that extend through the electrostatic chuck 201 to allow access to at least a portion of the side of the carrier 105 that is in contact with the electrostatic chuck 201. By allowing access to this side of the carrier 105, a gas such as helium may be brought into contact with the electrostatic chuck 201 and the carrier 105 in order to remove waste heat generated by the processes. Such access and cooling allows the operator to better control the temperature-dependent kinetics associated with some of the semiconductor device formation processes.

However, as one of ordinary skill in the art will recognize, the above described electrostatic chuck 201 is but one type of electrostatic chuck that may be utilized. A bipolar type of electrostatic chuck, in which a positive electrode and a negative electrode are both formed within the electrostatic chuck, may alternatively be utilized. This type of electrostatic chuck, and any other suitable type of electrostatic chucks, are fully intended to be included within the scope of the present invention.

By using the carrier 105 doped with ionic materials such as sodium or potassium, the positive charge applied to the electrode 205 generates a larger coulombic force. This larger coulombic force associated with the carrier 105 works to compensate for the reduced coulombic forces from the thinner semiconductor wafer 101, although other embodiments may be used with semiconductor wafers of any thickness if so desired.

Figure 3:
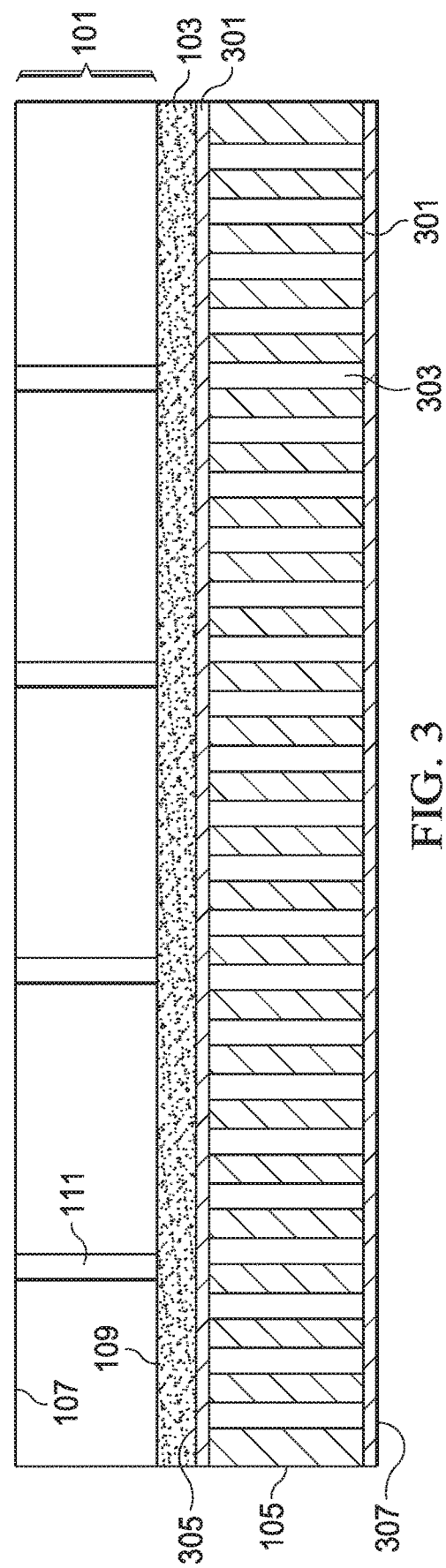
FIG. 3 illustrates a carrier comprising conductive layers and conductive vias in accordance with an embodiment.

FIG. 3 illustrates another embodiment in which, instead of doping the carrier 105 with ionic dopants such as sodium or potassium, conductive vias 303 are formed through the carrier 105. In this embodiment, the semiconductor wafer 101 and adhesive 103 may be similar or the same as the semiconductor 101 and adhesive 103 described above with respect to FIG. 1.

The carrier 105 may be initially received from a vendor with openings (not explicitly shown) for the conductive vias 303 already formed therein. Alternatively, however, the carrier 105 may be initially received as a solid material, and a suitable photolithographic and etching process may be utilized to form openings that will be filled to form the conductive vias 303. Under either method, the openings extend through the carrier 105 and may be between about 0.5 mm and about 0.1 mm in diameter, such as about 0.3 mm.

The conductive vias 303 may be filled with a liquid conductive organic material in order to enhance the coulombic forces. In an embodiment, conductive polymers such as polyanilines, doped polyanilines, polypyrroles, polythiophenes, thiophene oligomers, polyphenylene, combinations of these, and the like may be utilized. However, any suitable conductive organic material may alternatively be utilized. The liquid organic materials may be applied to the openings through a suitable coating process that flows the liquid conductive organic material into the openings to form the conductive vias 303. Once the liquid conductive organic material fills the openings, the liquid conductive organic material may be cured at a temperature of between about 120° C. and about 230° C., such as about 160° C., for a time of between about 10 minutes and about 1 hour, such as about 15 minutes, in order to phase change the liquid to a solid material.

Alternatively, solid materials may be utilized instead of the liquid conductive organic material to form the conductive vias 303. In this embodiment, solid materials such as titanium dioxide, aluminum oxide, indium tin oxide (ITO), combinations of these, or the like, may be deposited into the openings instead of coated into the openings. The solid materials may be deposited through a process such as chemical vapor deposition (CVD), plasma enhanced CVD (PECVD), or the like until the solid materials fill the openings to form the conductive vias 303.

Optionally, in addition to just the conductive vias 303, the carrier 105 may also have conductive layers 301 formed on both a first side 305 of the carrier 105 and a second side 307 of the carrier 105. The conductive layers 301 may be formed of the same materials as the conductive vias 303 (e.g., polyaniline or titanium oxide), or else may be formed of different materials as the conductive vias 303. Each of the conductive layers 301 may be formed through a suitable formation process, such as the coating or deposition processes described above with respect to the conductive vias 303. The conductive layers 301 may be formed to have a thickness over the carrier 105 of between about 1 μm and about 20 μm, such as about 3 μm.

Figure 4:
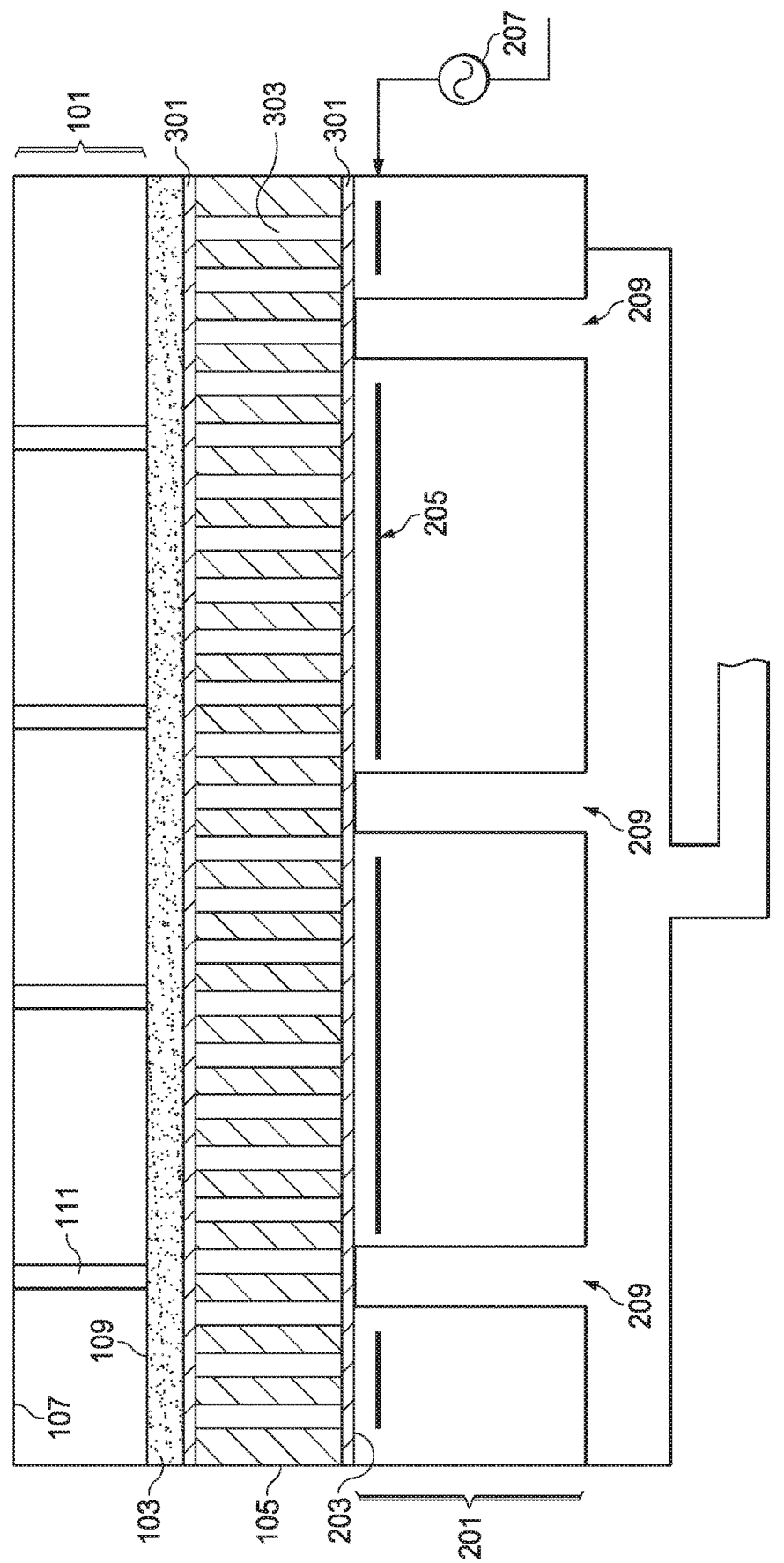
FIG. 4 illustrates the placement of the semiconductor wafer and the carrier described in FIG. 3 onto an electrostatic chuck in accordance with an embodiment.

FIG. 4 illustrates the placement of the carrier 105 and the semiconductor wafer 101 as illustrated in FIG. 3 onto a suitable electrostatic chuck 201. In an embodiment the electrostatic chuck 201 may be similar to the electrostatic chuck 201 described above with respect to FIG. 2, although it may alternatively be a different type of electrostatic chuck. When an electric charge is placed onto the electrode 205, the conductive organic material of the conductive layers 301 and the conductive vias 303 serve to amplify the coulombic forces which work to hold the semiconductor wafer 101 and carrier 105 to the electrostatic chuck 201.

By utilizing the conductive vias 303 and conductive layers 301 to amplify the coulombic forces, the overall voltage applied that is required to be applied to the electrostatic chuck may be reduced, thereby avoiding any potentially negative side effects of a high voltage applied to the semiconductor wafer 101. Additionally, by lowering the voltage applied to the chuck, the overall operating costs of the tool may also be reduced, leading to a cheaper production process.

Although embodiments and their advantages have been described in detail, it should be understood that various changes, substitutions, and alterations can be made herein without departing from the spirit and scope of the invention as defined by the appended claims. For example, the exact materials utilized may be modified to meet the goals. As another example, it will be readily understood by those skilled in the art that the various processes for producing the materials and structures associated with the present may be modified while still remaining within the scope and spirit of the present invention.

Moreover, the scope of application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method of manufacturing a semiconductor device comprising:
   providing a semiconductor wafer comprising a substrate and one or more through-substrate vias extending into a part of the substrate;
   providing a carrier comprising one or more conductive vias;
   after providing the carrier, attaching the semiconductor wafer to the carrier; and
   removing the semiconductor wafer from the carrier.

2. The method of claim 1, wherein the one or more conductive vias comprise a conductive organic material.

3. The method of claim 1, wherein the carrier further comprises:
   a dielectric material filling a space between the one or more conductive vias; and
   a first conductive layer in contact with a first surface of the dielectric material.

4. The method of claim 3, further comprising a second conductive layer in contact with a second surface of the dielectric material, the second surface being opposite the first surface of the dielectric material.

5. The method of claim 1, wherein the one or more conductive vias comprises aluminum oxide.

6. The method of claim 1, further comprising:
   placing the carrier adjacent to an electrostatic chuck, the electrostatic chuck comprising an electrode; and
   applying a first voltage to the electrode.

7. The method of claim 1, wherein the one or more through-substrate vias comprises copper.

8. The method of claim 1, wherein the carrier comprises glass.

9. The method of claim 1, further comprising after attaching the semiconductor wafer and prior to removing the semiconductor wafer, thinning the substrate to expose the one or more through-substrate vias.

10. A method of manufacturing a semiconductor device, the method comprising:
    forming a first conductive via within a carrier;
    after forming the first conductive via within the carrier, attaching a semiconductor substrate to the carrier, wherein one or more second conductive vias extend into the semiconductor substrate; and
    removing the carrier from the semiconductor substrate.

11. The method of claim 10, further comprising thinning the semiconductor substrate to expose the one or more second conductive vias while the semiconductor substrate is attached to the carrier.

12. The method of claim 10, wherein the forming the first conductive via within the carrier further comprises:
    forming an opening within the carrier; and
    filling the opening with a conductive material.

13. The method of claim 12, wherein the conductive material comprises a liquid conductive organic material.

14. The method of claim 13, further comprising curing the conductive material after the filling the opening with the conductive material.

15. The method of claim 10, further comprising forming a conductive layer on a surface of the carrier outside of the first conductive via.

16. The method of claim 10, further comprising:
    placing the carrier adjacent to an electrostatic chuck, the electrostatic chuck comprising an electrode; and
    applying a first voltage to the electrode.

17. The method of claim 10, wherein the semiconductor substrate comprises a semiconductor wafer.

18. A method comprising:
    providing a semiconductor wafer comprising a substrate;
    forming one or more through-substrate vias extending into a part of the substrate;
    providing a carrier;
    forming a conductive via within the carrier;
    after forming the conductive via, attaching the semiconductor wafer to the carrier; and
    removing the semiconductor wafer from the carrier.

19. The method of claim 18, further comprising filling the conductive via of the carrier with a liquid conductive organic material.

20. The method of claim 19, wherein the liquid conductive organic material comprises polyanilines, doped polyanilines, polypyrroles, polythiophenes, thiophene oligomers, or polyphenylene.

* * * * *